(12) United States Patent
Takemura et al.

(10) Patent No.: US 7,344,827 B2
(45) Date of Patent: *Mar. 18, 2008

(54) FINE CONTACT HOLE FORMING METHOD EMPLOYING THERMAL FLOW PROCESS

(75) Inventors: Katsuya Takemura, Niigata-ken (JP); Akihiro Seki, Niigata-ken (JP); Eiji Fukuda, Niigata-ken (JP)

(73) Assignee: Shin-Etsu Chemical Co., Inc., Tokyo (JP)

( * ) Notice: Subject to any disclaimer, the term of this patent is extended or adjusted under 35 U.S.C. 154(b) by 598 days.

This patent is subject to a terminal disclaimer.

(21) Appl. No.: 10/838,955

(22) Filed: May 4, 2004

(65) Prior Publication Data

US 2004/0224513 A1    Nov. 11, 2004

(30) Foreign Application Priority Data

May 7, 2003   (JP)   ............................. 2003-128577

(51) Int. Cl.
*G03F 7/00*   (2006.01)
(52) U.S. Cl. ...................................... 430/322; 430/330
(58) Field of Classification Search ................ 430/322, 430/330
See application file for complete search history.

(56) References Cited

U.S. PATENT DOCUMENTS

| | | | | |
|---|---|---|---|---|
| 4,491,628 A | | 1/1985 | Ito et al. ..................... | 430/176 |
| 4,603,101 A | | 7/1986 | Crivello ..................... | 430/270 |
| 5,096,802 A | * | 3/1992 | Hu .............................. | 430/328 |
| 5,252,435 A | | 10/1993 | Tani et al. .................. | 430/325 |
| 5,324,804 A | | 6/1994 | Steinmann .................. | 526/313 |
| 5,360,692 A | * | 11/1994 | Kawabe et al. ............. | 430/191 |
| 5,942,367 A | * | 8/1999 | Watanabe et al. ........... | 430/170 |
| 6,114,462 A | | 9/2000 | Watanabe et al. ........... | 525/298 |
| 6,312,869 B1 | | 11/2001 | Watanabe et al. ........ | 430/270.1 |
| 6,335,141 B1 | | 1/2002 | Watanabe et al. ........ | 430/270.1 |
| 6,593,056 B2 | * | 7/2003 | Takeda et al. .............. | 430/170 |
| 2001/0035394 A1 | * | 11/2001 | Takeda et al. ................ | 216/41 |
| 2001/0055727 A1 | * | 12/2001 | Kubota et al. ........... | 430/270.1 |

FOREIGN PATENT DOCUMENTS

| | | |
|---|---|---|
| JP | 62115440 | 5/1987 |
| JP | 63027829 | 2/1988 |
| JP | 90027660 | 6/1990 |
| JP | 3223858 | 10/1991 |
| JP | 4211258 | 8/1992 |
| JP | 6100488 | 4/1994 |
| JP | 10207066 A | 8/1998 |

* cited by examiner

*Primary Examiner*—Mark F. Huff
*Assistant Examiner*—Caleen O. Sullivan
(74) *Attorney, Agent, or Firm*—Myers, Bigel, Sibley & Sajovec, P.A.

(57) ABSTRACT

Provided is a contact hole forming method, wherein in a thermal flow step the contact hole size can be fixed after thermal flow even if the resist material lot changes, or, wherein at the same bake temperature the contracted size, namely the flow amount, can be fixed. More specifically, provided is a contact hole forming method comprising a step of coating a resist material onto a substrate, a step of heating the coated resist material, a step of exposing the heated resist material to light through a photo mask adapted for a contact hole pattern, a step of heating the exposed resist material, a step of forming the contact hole pattern subsequently by developing with a developing fluid and a step of thermal flow treatment for heating the obtained contact hole pattern, wherein the resist material comprises an organic compound which does not react with the other components within the resist material and does not change a resolution property, and wherein when the resist material lot is changed, an amount of the organic compound to be added is changed so as to keep the contact hole pattern identical before and after the lot change.

8 Claims, 1 Drawing Sheet

FINE CONTACT HOLE FORMING METHOD EMPLOYING THERMAL FLOW PROCESS

CROSS-REFERENCE TO RELATED APPLICATIONS

The present application claims priority to Japanese Patent Application No. 2003-128577, filed May 7, 2003, the disclosure of which is incorporated herein by reference in its entirety.

BACKGROUND OF THE INVENTION

1. Field of the Invention

The present invention relates to the step of further contracting a contact hole size called thermal flow which is heat treatment for a contact hole pattern in the formation of contact holes. More specifically, the present invention relates to ultra fine contact hole forming methods for adjustably varying the amount of a stable organic compound which does not react with the various components of the resist material and which does not alter a resolution property. It can circumvent the problems of post thermal flow contact hole size fluctuations and fluctuations in contraction size and flow amount which occur despite heating at identical temperatures when the resist material lots change. Thus, easy process control of the manufacture of ultra LSI can be attained.

2. Description of the Related Art

Recently developed acid-catalyzed chemical amplification positive resist materials (Japanese Patent Publication (JP-B) No. 2-27660/1990 and Japanese Patent Provisional Publication (JP-A) No. 63-27829/1988 for example) hold particular promise as a resist material having high sensitivity, resolution and resistance to dry etching and excellent properties, especially suitable for far ultraviolet lithography, using high luminescence KrF excimer lasers or ArF excimer lasers as a far ultraviolet light source.

Such chemical amplification positive resist materials are known in dual component systems comprising a base resin and an acid generator, and triple component systems comprising a base resin, an acid generator and a dissolution controlling agent having an acid-labile group.

For example, Japanese Patent Provisional Publication (JP-A) No. 62-115440/1987 proposes a resist material comprising poly-4-tert-butoxystyrene and an acid generator, and similarly Japanese Patent Provisional Publication (JP-A) No. 3-223858/1991 proposes a dual component system resist material comprising a resin having a tert-butoxy group and an acid generator. Further, Japanese Patent Provisional Publication (JP-A) No. 4-211258/1992 proposes a dual component system resist material comprising a polyhydroxystyrene having a methyl, isopropyl, tert-butyl, tetrahydropyranyl or trimethylsilyl group, and an acid generator.

Still further, Japanese Patent Provisional Publication (JP-A) No. 6-100488/1994 proposes a resist material comprising a polydihydroxystyrene derivative such as poly[3,4-bis(2-tetrahydroxypyranyloxy)styrene], poly[3,4-bis(tert-butoxycarbonyloxy)styrene] or poly[3,5-bis(2-tetrahydropyranyloxy)styrene], and an acid generator.

The improvement and development of the resist resin of those resist materials have advanced. According to Japanese Patent Provisional Publication (JP-A) No. 10-207066/1998, a resist material is proposed which imparts a high contrast and a high resolution, by cross-linking a base resin with a cross-linking group containing a C—O—C group and detaching the cross-linking group by the acid generated after exposing the acid generator to light.

However, even using these chemical amplification positive resist materials having such increased resolving power, it is difficult to realize a contact hole size with a diameter of no more than 0.20 μm, and a resist material for forming a contact hole pattern satisfying the demands of the next generation LSI devices is difficult to find.

On the other hand, there is a contact hole size contraction method (this process technology is noted below as "thermal flow") known as a process technology for forming contact hole sizes of no greater than 0.2 μm by heating the contact hole pattern so as to fluidize a resist film. By using this thermal flow technology, it is possible to form ultra fine contact hole sizes of 0.10 μm or 0.15 μm.

SUMMARY OF THE INVENTION

However, in the ultra fine contact hole forming method using this thermal flow technology, there is a problem that controlling the desired contact hole size with respect to the heating temperature is extremely difficult. That is to say, every time when there is a lot change of the chemical amplification positive resist material, there is the problem of irregularities between lots of the resist material with fluctuations of the contact hole size after thermal flow, and fluctuations of the flow amounts despite heat treatment at the same temperature. Thus, the thermal flow step needs to be optimized every time the resist material lot is changed. In other words, it is necessary to investigate anew the heat processing conditions to achieve the desired contact hole size. This problem gives rise to reductions in throughput because process management becomes extremely complex and time is required for the investigation.

The problem will be explained in more detail. The chemical amplification positive resist material effective for forming a fine pattern is manufactured by dissolving a polymer containing an acid-labile group as a base resin (B), an acid generator (C), a basic compound (D) into an organic solvent (A) and formulating them. However, minor variations are generated between the manufacturing lots. These variations cause the fluctuations in contact hole size after thermal flow. Because of this, it is necessary to carry out the formulation with meticulous care.

For example, it is clear that with even a slight difference in the actual amount of acid generator (C) added for each lot, there will be a change in the contact hole size after thermal flow.

However, even if the formulation is carried out with meticulous care, variations between resist material lots can be observed at the thermal flow step. For example, in the base resin containing acid-labile groups (B) which is used in the chemical amplification resist, it is clear that impurities within the base resin affect the thermal flow step. In practice, even if the formulation is weighed out accurately with utmost care, when impurities are comprised in the base resin, the amount of base resin added differs, variations are observed as measuring errors and thermal flow is affected. Similarly when impurities are contained in the acid generator (C), there are fluctuations between lots in the actual amount added, and it becomes problematic to accurately match to thermal flow between each lot.

Furthermore, it hardly needs to be mentioned that the thermal flow characteristics depend on the thermal properties of the base resin. That is, because the thermal conditions of the heat treatment which contract the contact hole size depend on the glass transition point of the base resin, variations between thermal flow lots cannot be controllably minimized without matching to the physical properties of the base resin (B). The higher the temperature of the glass transition point is, the higher the temperature becomes at which thermal flow is carried out, while the lower the glass transition point is, the lower the thermal flow temperature becomes. In practice, it is standard practice that thermal flow is carried out at a temperature in the vicinity of the glass transition point of the base resin. It is known that the glass transition point of the base resin is greatly dependent on the molecular weight of the resin, the degree of dispersion, and the content of acid-labile groups. For example, if the molecular weight is much larger than the design value, the glass transition point rises and the thermal flow amount (the contraction amount of the contact holes) is reduced. Further, when the ratio of acid-labile groups in the base resin is higher than targeted, the thermal flow amount increases because the glass transition point is lowered. It is practically impossible to precisely match the physical properties of the base resin, so the molecular weight, degree of dispersion and the ratio of acid-labile groups between product lots of base resin cannot be made strictly uniform.

To eliminate the variations between product lots of base resin, an averaging method has been suggested to blend together a number of lots. However, as this method requires storing a large number of lots of base resin and arranging tank facilities for the storage, it cannot be said to be a rational method. Furthermore, also in this method of blending, it is necessary to match the thermal properties of the base resin and the thermal flow characteristics taking into consideration a large number of parameters such as the molecular weight, the degree of dispersion and the ratio of acid-labile groups of the base resin and impurities contained within the base resin for example. Thus, it is not possible to determine the blend ratio by easy calculation. After blending it is necessary to confirm by experimentation the actual thermal flow amount, thus making it very complicated.

Thus, to controllably minimize the variations in the process on the resist side to reduce the contact hole size using thermal flow used to be a very difficult matter.

Furthermore, while recognizing these variations in the resist material, when attempting to optimize the thermal process step and investigate the conditions in the ultra LSI manufacturing step, as was explained previously, process management becomes extremely complex. Because this causes a reduction in throughput and a drop in yield as time is required for investigation, it is absolutely necessary to eliminate the thermal flow lot variations prior to the ultra LSI manufacturing step.

Having considered the facts of the situation, it is an object of the present invention to provide a contact hole forming method, wherein the contact hole size can be constant after the thermal flow even if the resist material lot changes, or, wherein at the same bake temperature the contracted size, that is to say the flow amount, can be constant.

As a result of repeated keen investigations into achieving the object described above, the inventors of the present invention have found a contact hole forming method which allows a great reduction in lot variations at the thermal flow step, regarding a thermal flow process which contracts a contact hole size by baking the contact hole formed from a resist material. That is, a contact hole size is constant after thermal flow even with a change in resist material lot, or at the same baking temperature, the size contraction, that is to say the flow amount, can be constant in the thermal flow step. The method is based on the adjustment by varying the amount of a stable organic compound which does not react with the resist components and does not change the resolution properties.

More specifically, the present invention relates to a contact hole forming method and the contact hole pattern obtained by such method, comprising a step of coating a resist material onto a substrate, a step of heating the coated resist material, a step of exposing the heated resist material to light through a photo mask adapted for a contact hole pattern, a step of heating the exposed resist material, a step of forming the contact hole pattern subsequently by developing with a developing fluid, and a step of thermal flow treatment for heating the obtained contact hole pattern, wherein the resist material comprises an organic compound which does not react with components within the resist material and does not change a resolution property, and wherein when the resist material lot is changed, an amount of the organic compound to be added is changed so as to keep the contact hole pattern identical before and after the lot change.

After formation of contact holes using a resist material, in a thermal flow step in which contact holes are contracted by baking it is possible to fix the contact hole size after thermal flow even with a change in resist material lot. Or it is possible to fix the contracted size, namely the flow amount, at the same bake temperature. Consequently, as well as facilitating adjustment of resist production, when manufacturing ultra LSI which is manufactured by ultrafine contact hole formation, there are advantages in facilitation of process management and increase in manufacturing yield.

DETAILED DESCRIPTION OF THE PREFERRED EMBODIMENTS

Figure 1:
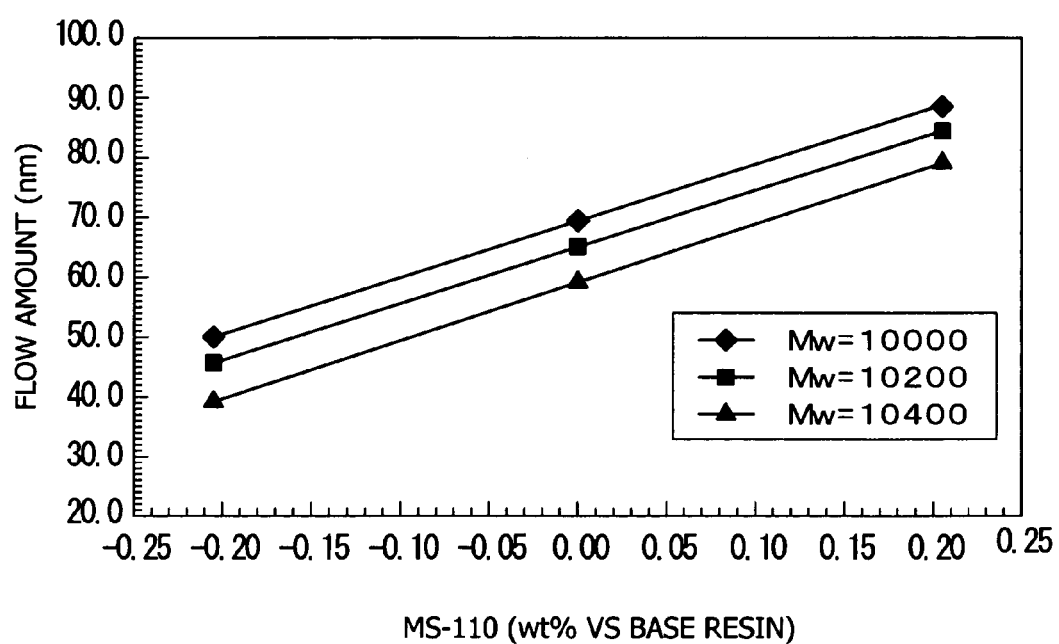
FIG. 1 is a graph showing a relationship between a varied amount of MS-110 (wt % with respect to the base resin) and flow (nm) amount.

After the investigations described below, the inventors found a method which can extremely reduce the lot variations in the thermal flow step.

As described above, the thermal flow temperature is greatly dependent on the glass transition point of the base resin, specifically it is greatly dependent upon the glass transition point of the entire resist film comprising a base resin and an acid generator and the like. When the glass transition point is high, the thermal flow may be carried out at a high temperature, and when the glass transition point is low, the thermal flow may be carried out at a low temperature. The glass transition point of the base resin depends on the molecular weight, dispersion and content of acid-labile groups of the base resin. Further, it is known that the glass transition point of the whole resist film depends on the composition of the resist material. Still further, the glass transition point of the resist film was confirmed to depend upon the amount of the organic compound which is contained within the resist film. In other words, increasing the content of organic compounds lowered the glass transition point of the resist film, and decreased the heating temperature of the thermal flow. This was believed to be because the organic compound within the resist film acts as a plasticizer. Thus, it was found that the variations in the thermal flow characteristics between lots, for example, due to a subtle change in the physical properties of the base resin, can be kept small by varying the amount of the organic compound. Then, further investigation led to the completion of the present invention.

In order to reduce the lot variations of the thermal flow, the organic compound whose amount is varied must not be a compound such as acid generators. In other words, the organic compound must not affect the resolution property in the contact hole forming step which occurs before the thermal flow. By varying the content of the organic compound acid generator, it is certainly possible to control the temperature at which the flow is carried out, or the flow amount which occurs at a given temperature. However, the organic compound acid generator is not preferred because it changes a basic resolution property such as particularly sensitivity, DOF (degree of focus) or a minimum resolution size of the contact hole during the formation of the contact holes.

It may not be preferable to use the organic compound containing an aromatic ring when an amount of the organic compound is varied to reduce lot variations of the thermal flows. The compound containing an aromatic ring absorbs far ultraviolet light such as KrF excimer laser light or ArF excimer laser light which is often utilized in lithography for resolving contact holes. Then, it may not be preferred because an increase or decrease of the compound will change the transmittance ratio of the resist film so that there is the risk of a change in the shape of the contact holes formed.

On the other hand, when an acidic compound is used for the organic compound whose amount is varied to reduce lot variations of the thermal flows, the acidic part of the compound itself reacts with the acid-labile group of the base resins so that sensitivity fluctuates, a pattern shape changes and particularly the top portion of the pattern becomes rounded. Thus, the acidic compound should be avoided.

Similarly, when a basic compound is used as the organic compound whose amount is varied to reduce lot variations of the thermal flow, sensitivity changes. Thus, the basic compound should be avoided.

Furthermore, when a low boiling point compound which will evaporate from the resist film during the process is used as the organic compound whose amount is varied to reduce lot variation of the thermal flow, then the desired control of the flow variations becomes very difficult when the resist film is laid out to dry. Further, the organic compound cannot be a compound which will cause faults such as contamination with impurities in the resist pattern.

The organic compound whose amount is varied to reduce lot variations of the thermal flow, has to be selected so that it will not have a reaction during storage of resist material and a resist solution. Further, the compound must not be one that will generate particles or foreign matter in the resist solution.

As the result of intense study of organic compounds which satisfy these conditions and whose amount is varied in order to reduce the lot variation of the thermal flow, the organic compound which does not react with components in the resist material and which does not change the resolution property, may preferably include an aliphatic compound having a pH of 5.0 to 8.0 and a boiling point at atmospheric pressure of above 200° C. The organic compound may preferably include, but not limited to, polyoxyalkylene alkyl ether esters, polyoxyalkylene alkyl ether, polyoxyalkylene dialkyl ether, polyoxyalkylene aralkyl alkyl ether, polyoxyalkylene aralkyl ether, polyoxyalkylene diaralkyl ether and polyoxyalkylene laureates, as well as polyoxyethylene nonyl phenyl ether, polyoxyethylene alkyl ether, polyoxyethylene lauryl ether, polyoxyethylene higher alcohol ether wherein the higher alcohol has preferably 6 to 20 carbons and more preferably 6 to 12 carbons, polyoxyalkylene alkyl ether, polyoxyethylene derivatives and polyoxyethylene sorbitan monolaurate. It may be used singly or in admixture of two or more. It may be preferably used singly because of simpler and easier operation for increasing or decreasing the amount of the organic compound in order to suppress thermal flow lot variations.

The organic compound for reducing the thermal flow lot variation of the present invention may include commercial products by Nicca Chemical Co. Ltd. such as Sunmall "N-60SM (polyoxyethylene nonyl phenyl ether)", "L-50 (polyoxyethylene alkyl ether)" and "SE-70 (polyoxyethylene alkyl ether)"; and those by Kao Corporation such as Emulgen "108 (polyoxyethylene lauryl ether)" "707 (polyoxyethylene higher alcohol ether)", "709 (polyoxyethylene higher alcohol ether)", "LS-106 (polyoxyalkylene alkyl ether)", "LS-110 (polyoxyalkylene alkyl ether)", "MS-110 (polyoxyalkylene alkyl ether)", "A-60 (polyoxyethylene derivative)", "B-66 (polyoxyethylene derivative)" and Rheodol "TW-L106 (polyoxyethylene sorbitan monolaurate)". Of these products, it may be preferable to use Emulgen MS-110 and Rheodol TW-L106.

According to the present invention, a resist material to which the amount varying organic compound is added may include resist materials known in the art and may be typically a positive resist material.

The positive resist material may comprise a base resin which is an alkali insoluble or poorly soluble resin containing an acidic functional group which is protected by an acid-labile group, and becomes alkali soluble when the acid-labile group is eliminated; an acid generator which generates acid upon irradiation of far ultraviolet light, x-rays or electron beams or the like; and typically, an organic solvent which dissolves these components. If necessary, the resist material may comprise an additive such as basic substance, acidic substance or a dissolution controlling agent.

The base resin used in the positive resist material, the resin which is an alkali-insoluble or poorly soluble resin containing an acidic functional group protected by an acid-labile group and which is alkali-soluble when the acid-labile group is eliminated, can be a compound known in the art and there is no particular limitation to it.

More specifically, it is possible to apply a chemical amplification type resist material containing as its main component polyhydroxystyrene which is protected by two or more types of the acid-labile groups described in Japan Patent Provisional Publication No. 9-211866/1997, a chemical amplification type resist material containing as its main component polyhydroxystyrene which is protected by two or more of the acid-labile groups and acid labile cross-linking groups described in Japanese Patent Provisional Publication No. 11-190904/1999, a chemical amplification type resist material containing as its main components a copolymer of acrylate and hydroxystyrene which is protected by an acid-labile group described in Japan Patent Provisional Publication No. 6-266112/1995, or a chemical amplification type resist material for ArF excimer laser containing as its main component a polyacrylic resin or a polycycloolefin resin.

According to the present invention, the acid generator which is also used in the positive resist material, may be an acid generator which generates acid by irradiation with far ultraviolet light, x-rays or electron rays or the like, and be any of the acid generators known in the art without any particular limitation.

The acid generator may include onium salts such as triphenylsulfonium trifluoromethanesulfonate, p-tert-butoxyphenyldiphenylsulfonium trifluoromethanesulfonate, tris(p-tert-butoxyphenyl)sulfonium trifluoromethanesulfonate, triphenylsulfonium p-toluenesulfonate, p-tert-butoxyphenyldiphenylsulfonium p-toluenesulfonate and tris(p-tert-butoxyphenylsulfonium p-toluenesulfonate; diazomethane derivatives such as bis(benzenesulfonyl)diazomethane, bis(p-toluenesulfonyl)diazomethane, bis(cyclohexylsulfonyl)diazomethane, bis(n-butylsulfonyl)diazomethane, bis(isobutylsulfonyl)diazomethane, bis(sec-butylsulfonyl)diazomethane, bis(n-propylsulphonyl)diazomethane, bis(isopropylsulfonyl)diazomethane, and bis(tert-butylsulfonyl)diazomethane; and glyoxime derivatives such as bis-o-(p-toluenesulfonyl)-α-dimethylglyoxime and bis-o-(n-butanesulfonyl)-α-dimethylglyoxime. Furthermore, it may also include β-ketosulfone derivatives such as 2-cyclohexylcarbonyl-2-(p-toluenesulfonyl)propane, disulfone derivatives such as diphenyldisulfone, nitrobenzylsulfonate derivatives such as 2,6-dinitribenzyl p-toluenesulfonate, ester sulfonate derivatives such as 1,2,3-tris(methanesulfonyloxy)benzene, and imidoyl sulfonate derivatives as phthalimidoyl trifluoromethanesulfonate. The acid generator may be used singly or in admixture of two or more.

The amount of acid generator used in the present invention may be preferably 0.2 to 15 parts by weight, more preferably 0.5 to 8 parts by weight with respect to a total mass of base resin of 100 parts by weight. When the amount is less than 0.2 parts by weight, when exposed to light the amount of acid generated is small so that resolution and sensitivity may be inferior. When the amount is more than 15 parts by weight, the resist transmittance ratio may drop so that resolution may be inferior.

According to the invention, the organic solvents typically used in the positive resist material may include, but not limited to, ketones such as cyclohexanone and methyl 2-n-amyl ketone; alcohols such as 3-methoxybutanol, 3-methyl-3-methoxybutanol, 1-methoxy-2-propanol and 1-ethoxy-2-propanol; ethers such as propylene glycol monomethyl ether, ethylene glycol monomethyl ether, propylene glycol monoethyl ether, ethylene glycol monoethyl ether, propylene glycol dimethyl ether and diethylene glycol diethyl ether; and esters such as propylene glycol monomethyl ether acetate, propylene glycol monoethyl ether acetate, ethyl lactate, ethyl pyruvate, butyl acetate, methyl 3-methoxypropionate and ethyl 3-ethoxypropionate. It can be used singly or in admixture of two or more.

The amount of organic solvent used may be 100 to 5000 parts by weight, preferably 200 to 4000 parts by weight, more preferably 300 to 3000 parts by weight with respect to 100 parts by weight of the base resin.

However, if necessary it is possible that the resist material of the present invention may contain an additive including basic substance or acidic substance or a dissolution controlling agent.

The basic substance may include primary, secondary and tertiary aliphatic amines, mixed amines, aromatic amines, heterocyclic amines, nitrogen-containing compounds containing a carboxy group, nitrogen-containing compounds containing sulfonyl groups, nitrogen-containing compounds containing hydroxy groups, nitrogen-containing compounds containing a hydroxyphenyl group, alcoholic nitrogen-containing compounds, amide derivatives and imide derivatives. Particularly preferable examples may be tertiary amines, aniline derivatives, pyrrolidine derivatives, pyridine derivatives, quinoline derivatives, amino acid derivatives, nitrogen-containing compounds containing a hydroxy group, nitrogen-containing compounds containing a hydroxyphenyl group, alcoholic nitrogen-containing compounds, amide derivatives, imide derivatives, tris{2-(methoxymethoxy)ethyl}amine, tris {2-(2-methoxyethoxy)ethyl}amine, tris [2-{(2-methoxyethoxy)methyl}ethyl]amine and 1-aza-15-crown-5.

The basic substance may be used singly or in admixture of two or more. The amount thereof may be preferably 0.01 to 2 parts by weight, particularly 0.01 to 1 parts by weight with respect to 100 parts by weight of the base resin. When the amount is less than 0.01 parts by weight, the blending effect may be lost. When it is more than 2 parts by weight, there may be an excessive drop in sensitivity.

The acidic substance may include, but not limited to, phenol, cresol, catechol, resorcinol, pyrogallol, phloroglycine, bis(4-hydroxyphenyl)methane, 2,2-bis(4'-hydroxyphenyl)propane, bis(4-hydroxyphenyl)sulfone, 1,1,1-tris(4'-hydroxyphenyl)ethane, 1,1,2-tris(4'-hydroxyphenyl)ethane, hydroxybenzophenone, 4-hydroxyphenylacetic acid, 3-hydroxyphenylacetic acid, 2-hydroxyphenylacetic acid, 3-(4-hydroxyphenyl)propionic acid, 3-(2-hydroxyphenyl)propionic acid, 2,5-dihydroxyphenylacetic acid, 3,4-dihydroxyphenylacetic acid, 1,2-phenylenediacetic acid, 1,3-phenylenediacetic acid, 1,4-phenylenediacetic acid, 1,2-phenylenedioxydiacetic acid, 1,4-phenylenedipropanic acid, benzoic acid, salicylic acid, 4,4-bis(4'-hydroxyphenyl)valeric acid, 4-tert-butoxyphenylacetic acid, 4-(4-hydroxyphenyl)butyric acid, 3,4-dihydroxymandelic acid and 4-hydroxymandelic acid. The acidic substance may be more preferably salicylic acid and 4,4-bis(4'-hydroxyphenyl)valeric acid. The acidic substance may be used singly or in admixture of two or more.

The amount of acidic substance may be no more than 5 parts by weight and preferably no more than 1 part by weight with respect to 100 parts by weight of the base resin. When the amount is more than 5 parts by weight, resolution may be deteriorated.

The dissolution controlling agent may include, but not limited to, a compound having a molecular weight of not more than 3000 whose solubility in alkali developing fluid changes due to the action of acid, particularly low molecular weight phenols or carboxylic acid derivative having molecular weight of not more than 2500 where a portion or all of the phenol or carboxylic acid derivative has been substituted by an acid-labile group.

The dissolution controlling agent may include, but not limited to, 3,3'5,5'-tetrafluoro[(1,1'-biphenyl)-4,4'-di-t-butoxycarbonyl], 4,4'-[2,2,2-trifluoro-1-(trifluoromethyl)ethylidene]bisphenol-4,4'-di-t-butoxycarbonyl, bis(4-(2'-tetrahydropyranyloxy)phenyl)methane, bis(4-(2'-tetrahydrofuranyloxy)phenyl)methane, bis(4-tert-butoxyphenyl)methane, bis(4-tert-butoxycarbonyloxyphenyl)methane, bis(4-tert-butoxycarbonylmethyloxyphenyl)methane, bis(4-(1'-ethoxyethoxy)phenyl)methane, bis(4-(1'-ethoxypropyloxy)phenyl)methane, 2,2-bis(4'-(2"tetrahydropyranyloxy))propane, 2,2-bis(4'-(2"tetrahydrofuranyloxy)phenyl)propane, 2,2-bis(4'-tert-butoxyphenyl)propane, 2,2-bis(4'-tert-butoxycarbonyloxyphenyl)propane, 2,2-bis(4-tert-butoxycarbonylmethyloxyphenyl)propane, 2,2-bis(4'-(1"-ethoxyethoxy)phenyl)propane, 2,2-bis(4'-(1"-ethoxypropyloxy)phenyl)propane, tert-butyl 4,4-bis(4'-(2"tetrahydropyranyloxy)phenyl)valerate, tert-butyl 4,4-bis(4'-(2"tetrahydrofuranyloxy)phenyl)valerate, tert-butyl 4,4-bis(4'-tert-butoxyphenyl)valerate, 4,4-bis(4-tert-butoxycarbonyloxyphenyl)valerate, tert-butyl 4,4-bis(4'-tert-butoxycarbonylmethyloxyphenyl)valerate, tert-butyl 4,4-bis(4'-(1"-ethoxyethoxy)phenyl)valerate, tert-butyl 4,4-bis(4'-(1"-ethoxypropyloxy)phenyl)valerate, tris(4-(2'tetrahydropyranyloxy)phenyl)methane, tris(4-(2'tetrahydrofuranyloxy)phenyl)methane, tris(4-tert-butoxyphenyl)methane, tris(4-tert-butoxycarbonyloxyphenyl)methane, tris (4-tert-butoxycarbonyloxymethylphenyl)methane, tris(4-(1'-ethoxyethoxy)phenyl)methane, tris(4-(1'-ethoxypropyloxy)phenyl)methane, 1,1,2-tris(4'-(2"tetrahydropyranyloxy)phenyl)ethane, 1,1,2-tris(4'-(2"tetrahydrofuranyloxy)phenyl)ethane, 1,1,2-tris(4'-tert-butoxyphenyl)ethane, 1,1,2-tris(4'-tert-butoxycarbonyloxyphenyl)ethane, 1,1,2-tris(4'-tert-butoxycarbonylmethyloxyphenyl)ethane, 1,1,2-tris(4'-(1'-ethoxyethoxy)phenyl)ethane, 1,1,2-tris(4'-(1'-ethoxypropyloxy)phenyl)ethane, 1,1-t-butyl 2-trifluoromethylbenzenecarboxylate, t-butyl 2-trifluoromethylcyclohexanecarboxylate, t-butyl decahydronaphthalene-2,6-dicarboxylate, t-butyl cholate, t-butyl deoxycholate, t-butyl adamantanecarboxylate, t-butyl adamantaneacetate and [tetra-t-butyl 1,1'-bicyclohexyl-3,3', 4,4'-tetracarboxylate].

The amount of the dissolution controlling agent to be added to the resist material of the present invention may be not more than 20 parts by weight, preferably not more than 15 parts by weight, with respect to 100 parts by weight of solid portion in the resist material. When the weight is more than 20 parts by weight, heat resistance may drop due to an increase in monomer components.

So as to reduce the thermal flow lot variation, a method using the organic compound whose amount varies can suppress thermal flow lot variations may comprise a step of adjusting the amount of the organic compound in a range of 0.2 to 0.5 wt %, preferably 0.5 to 2 wt % with respect to the base resin used in the resist material which can form the much finer contact holes by the action of thermal flow after the formation of contact holes. When the flow amount is larger than the target flow amount, it is necessary to reduce the amount of the organic compound. However, when the amount of the organic compound is less than 0.2 wt %, the flow amount may not be matched effectively because of a limitation in the reduction amount. On the other hand, when the amount of the organic compound is more than 5 wt %, the characteristics of the lithography which forms the contact holes may be affected.

Before illustrating a more specific method for use of the organic compound whose amount is varied to reduce thermal flow lot variations, the contact hole formation step and thermal flow step will be explained.

To form a contact hole pattern using chemical amplification positive type resist material, well-known lithographic technology may be used. For example, the resist material is spin-coated on a silicon wafer substrate or the like so as to form a film having a thickness of 0.5 to 2.0 µm and prebaking on a hotplate at 60 to 150° C. for 1 to 10 min, preferably at 80 to 120° C. for 1 to 5 min. Next, the mask which forms the desired contact hole pattern is positioned above the resist film, and after irradiation with a high energy beam such as far ultraviolet light of a wavelength of not more than 300 nm, excimer laser light or X-rays, or electron beams with an exposure of the order of 1 to 200 mJ/cm², or preferably of the order of 10 to 100 mJ/cm², the resist film may be post-exposure baked (PEB) on a hotplate at 60 to 150° C. for 1 to 5 minutes, preferably at 80 to 120° C. for 1 to 3 minutes. Furthermore, using an aqueous alkali developing fluid of a 0.1 to 5 wt %, preferably 2 to 3 wt % tetramethyl ammonium hydroxide (TMAH) or the like, the desired contact hole pattern may be formed on the substrate by developing for 1 to 3 minutes, preferably for 0.5 to 2 minutes by an ordinary method such as a dip method, a puddle method or a spray method.

Subsequently, the thermal flow may be carried out by heating the formed contact holes on a hot plate. The flow heating temperature may be preferably 100 to 200° C., and if the accuracy of the hot plate is taken into consideration, 100 to 150° C. may be particularly preferable. The heating time period may be preferably 60 to 120 s.

Although the contact hole formed by exposure and developing may have a size of 0.20 to 0.30 µm, it may be contracted to be an ultra small hole of 0.10 to 0.15 µm for the contact hole pattern by carrying out thermal flow.

The material of the present invention may be optimal for fine patterning, particularly by such high energy beams as far ultraviolet beams of 254 to 193 nm or excimer lasers, X-rays or electron beams.

Use of the organic compound whose amount is varied for the purpose of reduction of thermal flow lot variation will be explained.

First, less than a predetermined amount of the organic compound may be added into the resist material, and contact holes may be formed by the method described above. Then, the thermal flow on the contact holes may be carried out at the heating condition described previously, and the flow amount may be measured. The object of the present invention is to eliminate the problem of variations in thermal flow between resist lots so that the thermal flow amount is measured simultaneously and at the same condition for the target lot (standard lot) or a previously manufactured lot. Although the standard lot and the previously manufactured lot also contain the organic compound, the lot being produced contains lower content of the organic compound so that it gives a measured value of a lower flow amount.

Next, for the purpose of matching the flow amount of the produced lot to that of the target, an appropriate amount of the organic compound is added. If the relationship between the added amount of the organic compound and change of the flow amount is predetermined, the amount to be added can be easily determined so that the flow amount can be easily matched to the target.

The flow amount can be expressed as the difference in hole size before and after heating. In other words, the contact hole sizes after the development and after the following heating at the predetermined condition are measured with a scanning electron microscope.

The graph in FIG. 1 is an example showing a relationship between varying amounts of MS-110 (polyoxyalkylene alkyl ether manufactured by Kao Corporation) and flow amounts. In FIG. 1, setting as standard the case in which the content of MS-110 is 0.5 wt % with respect to the base resin (the varied amount of MS-110 is 0 wt %), a positive wt % means the amount that MS-110 is increased, and a negative wt % means the amount that it is decreased.

FIG. 1 shows three standards of the base resins used in the resist material. That is, the flow amounts were measured under the same conditions at three points of the base resins having average molecular weight (Mw) of 10,000, 10,200 and 10,400, respectively. As explained previously it can be seen that the larger the molecular weight is, the smaller the flow amount is.

However, the relationship between the flow amount and the variable amount of MS-110 (polyoxyalkylene alkyl ether manufactured by Kao Corporation) for controlling the thermal flow amount is of the same slope independent of the molecular weight of the base resin. Change of 0.1 wt % in MS-110 (with respect to the base resin) results in the flow amount change of approximately 9.6 nm. This fact indicates that the thermal flow amount can be desirably controlled without depending on the thermal or other properties of the base resin.

As explained previously, the MS-110 is added first in a small amount to the lot being produced, and then the flow amount is measured. Because the flow amount is probably not sufficient to meet the desired flow amount, another amount of MS-110 on basis of calculation is added thereto so that the desired flow amount can be obtained. It will be explained based on the example that the flow amount of the lot being produced is short by 10 nm to reach the desirable flow amount. In other words, the flow amount is insufficient by 10 nm when compared with the standard lot or the previous lot. In this example, MS-110 is increased by 0.104 wt % based on the calculation (10 nm÷9.6 nm/0.1 wt %). Then, the flow variations can be eliminated. Even when the amount of MS-110 varies, there will be no change in the contact hole forming resolution property or lithographic characteristics.

Furthermore, even when the resist composition, or a physical property or other properties of the base polymer are unknown, as long as it is a resist material capable of forming a contact hole and of thermal flow, the flow amount can be controlled by appropriately increasing the organic compound for adjusting the flow amount. Then, it also becomes possible to adjust suitably the flow amount of commercially available resist material. Accordingly, lot changes also comprise changes to other commercially available resist material without limitation to the resist material produced at the same manner.

An example of eliminating flow amount variations among lots has been illustrated up to this point. In addition, the same method of varying the amount of the organic compound can be also suitable as a means of fixing the heating temperature at which the same flow amount is obtained.

EXAMPLES

The present invention will be explained in more detail by showing examples. However, the invention is not limited to the examples.

For the positive chemical amplifying resist, a resist with the following composition is used.

(Resist Composition; Standard Composition)
Polyhydroxystyrene having a weight-average molecular weight of 11,000, wherein 14 mol % of the hydroxyl groups thereof are protected by 1-ethoxyethyl groups and 13 mol % of the hydroxyl groups are protected by tert-butoxycarbonyl groups: 80 parts by weight.
Bis(cyclohexylsulfonyl)diazomethane: 5 parts by weight.
Triethanol amine: 0.125 parts by weight
Surfactant: FC-430S (Made by Sumitomo 3M Corporation): 0.01 parts by weight
Propyleneglycol monomethyl ether acetate: 450 parts by weight
Emulgen MS-110 (Made by Kao Corporation): 1.0 wt % with respect to the base resin.

After the obtained resist material solution is filtered through a 0.2 μm Teflon (registered trade-mark) filter, it was applied with spin coating to onto a silicon wafer. It was 0.77 μm in the coating thickness. Next, this silicon wafer was baked on a hotplate at 100° C. for 90 seconds. A contact hole pattern was formed by exposing the resist material on the wafer to light with an excimer laser stepper (Nikon, NSR-S202A NA=0.6) equipped with a contact hole pattern reticule; then by baking the exposed resist material for 90 s at 110° C. (PEB: Post Exposure Bake); and developing the baked resist material in an aqueous 2.38 wt % solution of tetramethylammonium hydroxide. After the development, the contact hole size to be formed was targeted to 0.25 μm with a pitch of 1:2.

After the contact hole pattern was formed, the thermal flow heat treatment for contracting the contact holes was carried out. Each wafer was heated on a hotplate at 145° C. for 90 seconds as the heat treatment.

The contact hole size after the heat treatment was measured with a scanning electron microscope (Top Down SEM). Accoring to the measurement, the contact hole size was 190 nm and the flow amount was 60 nm. Defining the flow amount of 60 rim as the flow amount of a standard lot, the flow lot variations would be eliminated in the following step.

The same formulation as the above was used except lot changes of the base resin (product lots #A, #B, #C, #D) and the acid generator (product lots #E, #F) and change of the amount of MS-110 to 0.9 wt % decreased by 0.1 wt %. It should be noted the base resin in each product lot contained 14 mol % of the 1-ethoxyethyl acid-labile group and 13 mol % of the tert-butoxycarbonyl group and had been produced in the process for producing the base resin having the weight-average molecular weight of 11,000. After each resist material was prepared, the contact hole formation and the thermal flow heat treatment were carried out in the same manner as described above.

Although exactly the same the base resin design and composition ratios of the formulation were used, variations in flow were observed as shown in Table 1.

TABLE 1

| Formulation Lot | Base Resin Lot | Acid Generator Lot | Thermal Flow Amount (nm) |
| --- | --- | --- | --- |
| 1 | #A | #E | 55 |
| 2 | #B | #E | 51 |
| 3 | #C | #E | 50 |
| 4 | #D | #E | 49 |
| 5 | #A | #F | 54 |

The amount of MS-110 was increased to eliminate the variations in thermal flow amount among the lots of Table 1. The amount of MS-110 for the adjustment and the result of the thermal flow heat treatment are shown.

TABLE 2

| Formulation Lot | MS-110 Amount (wt % based on the base resin) | Thermal Flow Amount (nm) |
| --- | --- | --- |
| 1 | 0.052 | 59 |
| 2 | 0.094 | 60 |
| 3 | 0.104 | 61 |
| 4 | 0.115 | 60 |
| 5 | 0.062 | 60 |

As shown in Table 2, the reduction of the variation of the thermal flow amount among the lots could be achieved.

The invention claimed is:
1. A method for forming a contact hole pattern comprising:
a step of coating a resist material onto a substrate;
a step of heating the coated resist material;

a step of exposing the heated resist material to light through a photo mask adapted for forming a contact hole pattern;

a step of heating the exposed resist material;

a step of forming the contact hole pattern subsequently by developing with a developing fluid; and a step of thermal flow treatment for heating the obtained contact hole pattern;

wherein the resist material comprises an organic compound which does not react with the other components within the resist material and does not change a resolution property, and wherein when a resist material lot is changed, an amount of the organic compound to be added is changed based on a predetermined relationship between the added amount of the organic compound and contraction of the contact hole pattern in order to keep the contact hole pattern identical before and after the lot change.

2. The method for forming a contact hole pattern according to claim 1, wherein said resist material is a chemical amplification type positive resist material, comprising:

an organic solvent;

a polymer containing an acid-labile group as a base resin;

an acid generator; and a basic compound.

3. The method for forming a contact hole pattern according to claim 1, wherein said organic compound is an aliphatic compound having a pH value of 5.0 to 8.0, and a boiling point at atmospheric pressure of at least 200° C.

4. The method for forming a contact hole pattern according to claim 2, wherein said organic compound is an aliphatic compound having a pH value of 5.0 to 8.0, and a boiling point at atmospheric pressure of at least 200° C.

5. The method for forming a contact hole pattern according to claim 1, wherein said organic compound is selected from the group consisting of polyoxyalkylene alkyl ether ester, polyoxyalkylene alkyl ether, polyoxyalkylene dialkyl ether, polyoxyalkylene aralkyl alkyl ether, polyoxyalkylene aralkyl ether, polyoxyalkylene diaralkyl ether and polyoxyalkylene laurate.

6. The method for forming a contact hole pattern according to claim 2, wherein said organic compound is selected from the group consisting of polyoxyalkylene alkyl ether ester, polyoxyalkylene alkyl ether, polyoxyalkylene dialkyl ether, polyoxyalkylene aralkyl alkyl ether, polyoxyalkylene aralkyl ether, polyoxyalkylene diaralkyl ether and polyoxyalkylene laurate.

7. The method for forming a contact hole pattern according to claim 3, wherein said organic compound is selected from the group consisting of polyoxyalkylene alkyl ether ester, polyoxyalkylene alkyl ether, polyoxyalkylene dialkyl ether, polyoxyalkylene aralkyl alkyl ether, polyoxyalkylene aralkyl ether, polyoxyalkylene diaralkyl ether and polyoxyalkylene laurate.

8. The method for forming a contact hole pattern according to claim 4, wherein said organic compound is selected from the group consisting of polyoxyalkylene alkyl ether ester, polyoxyalkylene alkyl ether, polyoxyalkylene dialkyl ether, polyoxyalkylene aralkyl alkyl ether, polyoxyalkylene aralkyl ether, polyoxyalkylene diaralkyl ether and polyoxyalkylene laurate.

* * * * *

UNITED STATES PATENT AND TRADEMARK OFFICE
CERTIFICATE OF CORRECTION

PATENT NO.        : 7,344,827 B2  
APPLICATION NO.   : 10/838955  
DATED             : March 18, 2008  
INVENTOR(S)       : Takemura et al.

Page 1 of 1

It is certified that error appears in the above-identified patent and that said Letters Patent is hereby corrected as shown below:

<u>On the Title Page:</u>

Item (73):  Please correct "Assignee:    Shin-Etsu Chemical Co., Inc., Tokyo (JP)"  
            To read -- Assignee:    Shin-Etsu Chemical Co., Ltd., Tokyo (JP) --

Signed and Sealed this

First Day of July, 2008

JON W. DUDAS  
*Director of the United States Patent and Trademark Office*